US012610498B2

(12) United States Patent
Meng et al.

(10) Patent No.: US 12,610,498 B2
(45) Date of Patent: Apr. 21, 2026

(54) HEAT DISSIPATION APPARATUS AND ELECTRIC POWER DEVICE

(71) Applicant: Huawei Digital Power Technologies Co., Ltd., Shenzhen (CN)

(72) Inventors: Hao Meng, Dongguan (CN); Qingsong Yang, Shanghai (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 210 days.

(21) Appl. No.: 18/508,676

(22) Filed: Nov. 14, 2023

(65) Prior Publication Data

US 2024/0164048 A1 May 16, 2024

(30) Foreign Application Priority Data

Nov. 15, 2022 (CN) .......................... 202223025223.2

(51) Int. Cl.
*H05K 7/20* (2006.01)

(52) U.S. Cl.
CPC ............................... *H05K 7/20145* (2013.01)

(58) Field of Classification Search
CPC . H05K 7/20145; H05K 7/20909; Y02D 10/00
See application file for complete search history.

(56) References Cited

U.S. PATENT DOCUMENTS

| | | | | |
|---|---|---|---|---|
| 6,421,236 B1 * | 7/2002 | Montoya | .............. | H05K 9/0016 |
| 6,643,130 B1 * | 11/2003 | DeMarchis | ........ | H05K 7/20181 |
| | | | | 361/695 |
| 6,646,878 B2 * | 11/2003 | Chan | .................. | H05K 7/20572 |
| | | | | 361/695 |
| 9,622,390 B2 * | 4/2017 | Hwang | .............. | H05K 7/20909 |
| 11,867,201 B2 * | 1/2024 | Killen, Jr. | ............ | F04D 29/541 |
| 2002/0145853 A1 | 10/2002 | Grouell et al. | | |
| 2009/0260874 A1 * | 10/2009 | Eckberg | ............... | H05K 7/1491 |
| | | | | 174/650 |
| 2011/0228477 A1 | 9/2011 | Hong | | |
| 2015/0264836 A1 * | 9/2015 | Ambriz | .............. | H05K 7/20181 |
| | | | | 165/104.34 |
| 2016/0079613 A1 * | 3/2016 | Gurunathan | ....... | H05K 7/20154 |
| | | | | 361/695 |
| 2016/0091264 A1 * | 3/2016 | Lu | ........................... | H02S 40/42 |
| | | | | 165/121 |

(Continued)

FOREIGN PATENT DOCUMENTS

| | | |
|---|---|---|
| CN | 208255792 U | 12/2018 |
| JP | H06105552 A | 4/1994 |

*Primary Examiner* — Stephen S Sul

(74) *Attorney, Agent, or Firm* — Conley Rose, P.C.

(57) ABSTRACT

A heat dissipation apparatus includes at least two heating components, at least two fans, and at least two isolation components. Heat dissipation channels are disposed inside the at least two heating components, and a fan is provided in each heat dissipation channel. An isolation component is coupled to an air inlet and/or an air outlet of the heat dissipation channel. The isolation component may isolate an air inlet or air outlet of each heating component from an air inlet or air outlet of another heating component, so as to avoid forming a loop between a heat dissipation channel in which a working fan is located and a heat dissipation channel in which a non-working fan is located.

20 Claims, 3 Drawing Sheets

230

(56)         References Cited

U.S. PATENT DOCUMENTS

2020/0100398 A1 *  3/2020  Meghpara .......... H05K 7/20145
2021/0329819 A1   10/2021  Xu et al.
2024/0032258 A1 *  1/2024  Chueh ................ H05K 7/20154

* cited by examiner

230

HEAT DISSIPATION APPARATUS AND ELECTRIC POWER DEVICE

CROSS-REFERENCE TO RELATED APPLICATIONS

This claims priority to Chinese Patent Application No. 202223025223.2 filed on Nov. 15, 2022, which is hereby incorporated by reference in its entirety.

TECHNICAL FIELD

The present disclosure relates to the field of heat dissipation technologies, and in particular, to a heat dissipation apparatus and an electric power device.

BACKGROUND

An energy storage system operates in a "one cluster, one management" mode. Energy storage units and power devices are disposed in one-to-one correspondence. A power device has a heat dissipation channel for heat dissipation of the power device, and a cooler fan in the heat dissipation channel continuously leads external air into the power device through an air inlet. Components of the power device exchange heat with air in the heat dissipation channel by using a channel wall body. At the same time, the cooler fan in the heat dissipation channel continuously discharges gas with heat exchanged to the atmosphere through an air outlet. Because a plurality of power devices is stacked and placed inside a housing, if one of the power devices breaks down, gas in the heat dissipation channel of the power device is to stop flowing. The gas discharged from the air outlet of a heat dissipation channel that normally works may flow back to a heat dissipation channel of the broken-down power device, causing a heat derating of other power units.

SUMMARY

To resolve the foregoing problem, embodiments of this application provide a heat dissipation apparatus. Gas discharged from a heat dissipation channel is directly discharged to the outside through an isolation component, or external gas enters the heat dissipation channel through the isolation component, so as to avoid a backflow caused by an interconnection of air outlets of adjacent heat dissipation channels or of air inlets of the adjacent heat dissipation channels.

Therefore, the following technical solutions are used in embodiments of this application.

According to a first aspect, embodiments of this application provide a heat dissipation apparatus, including: at least two heating components, where at least one heat dissipation channel is disposed inside each heat generating component, and the heat dissipation channel includes an air inlet and an air outlet; at least two fans, respectively disposed in heat dissipation channels of the at least two heating components; and at least two isolation components, respectively coupled to air inlets and/or air outlets of the heat dissipation channels of the at least two heating components, and configured to isolate an air inlet and/or air outlet of the heat dissipation channel of the heating component from an air inlet and/or air outlet of a heat dissipation channel of another heating component.

In this embodiment, the heat dissipation channels are disposed inside the at least two heating components, and the fan is disposed in each heat dissipation channel. The isolation component is coupled to the air inlet and/or an air outlet of the heat dissipation channel. The isolation component may isolate an air inlet or air outlet of each heating component from the air inlet or air outlet of the another heating component, so as to avoid the following case: Heat dissipation efficiency of the heat dissipation apparatus is reduced because a loop is formed between a heat dissipation channel in which a working fan is located and a heat dissipation channel in which a non-working fan is located.

In an implementation, the isolation component includes an air inlet and an air outlet, and an airflow direction of the air inlet and an airflow direction of the air outlet are disposed at an angle.

In this embodiment, when air outlets of two heating components are disposed opposite to each other, the air outlet of the heat dissipation channel of each heating component is connected to the air inlet of the isolation component. The air inlet and air outlet of the isolation component are disposed at an angle, so that high-temperature gas of the isolation component can be discharged from the air outlet to the outside. In this case, the isolation component is enabled to meet a requirement of opposite arrangement of the heating components, a flow distance of airflow and a space occupation proportion of the isolation component can be reduced, and space utilization of an entire machine can be improved.

In an implementation, the isolation component includes an air inlet and an air outlet, and the air inlet of the heating component, the air outlet of the heating component, the air inlet of the isolation component, and the air outlet of the isolation component are on a straight line.

In this embodiment, the air inlet of the heating component, the air outlet of the heating component, the air inlet of the isolation component, and the air outlet of the isolation component are on a straight line, and airflow flows along a straight line direction, so as to avoid reducing a flow speed of gas.

In an implementation, the isolation component further includes an air baffle, and the air baffle is disposed inside the isolation component, and is configured to change airflow in a first direction into airflow in a second direction, where the first direction and the second direction are different directions.

In this embodiment, the air baffle is disposed inside the isolation component to change a direction of an airflow that enters the air inlet, so as to avoid turbulence formed inside the isolation component and reduce a flow speed of the gas after high-temperature gas flows into the air inlet of the isolation component.

In an implementation, the air baffle is in an arc shape.

In an implementation, the heat dissipation apparatus further includes at least two heat sinks, where the at least two heat sinks are respectively disposed inside the heat dissipation channels of the at least two heating components, and are configured to transfer heat of the heating components to gas in the heat dissipation channels of the heating components.

In this embodiment, the heat sink is disposed inside the heat dissipation channel of the heating component, so as to quickly transfer heat of a heating device inside the heating component to the gas in the heat dissipation channel and improve a heat dissipation speed of the heating component.

In an implementation, at least one bolt hole is disposed at edges of air outlets of the at least two isolation components, and is configured to allow at least one screw to pass through the at least one bolt hole, and fasten the air outlets of the isolation components onto a structural member of the heat dissipation apparatus.

In an implementation, the at least two isolation components are symmetrically disposed and/or disposed in parallel in a stacked manner.

In an implementation, the heat dissipation apparatus includes a sealed structure and at least one isolation board, and the at least one isolation board is disposed in the sealed structure to isolate the at least two isolation components.

In this embodiment, when the at least two isolation components are together, the at least two isolation components may include the at least one isolation board and the sealed structure. The at least one isolation board isolates the sealed structure to obtain a plurality of subspaces that are used as isolation components. In this case, costs of an isolation component can be reduced.

According to a second aspect, embodiments of this application provide an electric power device, including a structural member, and at least one heat dissipation apparatus according to the possible implementations of the first aspect, where the at least one heat dissipation apparatus is disposed inside the structural member.

BRIEF DESCRIPTION OF DRAWINGS

The following briefly describes accompanying drawings required for describing embodiments or a conventional technology.

DESCRIPTION OF EMBODIMENTS

The following describes technical solutions in embodiments of this application with reference to accompanying drawings in embodiments of this application.

In descriptions of this application, orientation or location relationships indicated by terms "center", "above", "below", "front", "back", "left", "right", "vertical", "horizontal", "top", "bottom", "inside", "outside", and the like are orientation or location relationships based on the accompanying drawings, and are merely for ease of describing this application and simplifying description, rather than indicating or implying that an apparatus or element referred to needs to have a specific orientation or needs to be constructed and operated in a specific orientation. Therefore, such terms cannot be construed as a limitation on this application.

In the descriptions of this application, it should be noted that, unless otherwise expressly specified and limited, the terms "mount", "link", and "connect" should be understood in a broad sense, for example, a "connection" may mean a fixed connection, may be a detachable connection, or may be a butt joint connection or an integrated connection. A person of ordinary skill in the art may understand specific meanings of the foregoing terms in this application based on a specific case.

In the descriptions of this application, the term "and/or" describes an association relationship between associated objects, and indicates that three relationships may exist. For example, A and/or B may represent three cases: Only A exists, both A and B exist, and only B exists. The character "/" in this specification indicates an "or" relationship between the associated objects. For example, A/B indicates A or B.

In the descriptions of this application, the terms "first", "second", and the like are intended to distinguish between different objects but do not indicate a particular order of the objects. For example, a first response message, a second response message, and the like are intended to distinguish between different response messages, but do not indicate a particular order of the response messages.

In embodiments of this application, the expression such as "in an embodiment" or "for example" represents giving an example, an illustration, or a description. Any embodiment or design solution described as "in an embodiment" or "for example" in embodiments of this application shall not be explained as being more preferred or having more advantages than another embodiment or design solution. Exactly, the use of the expression such as "in an embodiment" or "for example" is intended to present a related concept in a specific manner.

In the descriptions of this specification, the described specific features, structures, materials, or characteristics may be combined in a suitable manner in any one or more of embodiments or examples.

Figure 1:
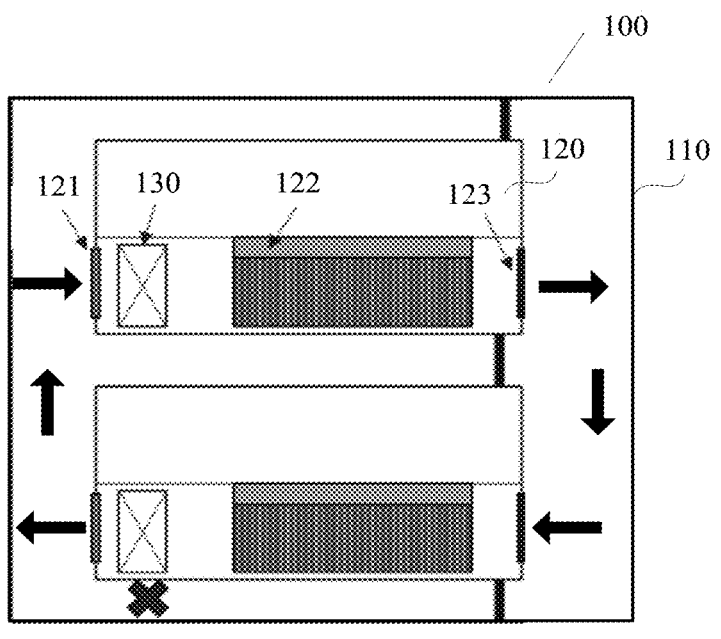
FIG. 1 is a schematic diagram of a structure of a heat dissipation apparatus in a conventional technology.

FIG. 1 is a schematic diagram of a structure of a heat dissipation apparatus in a conventional technology. As shown in FIG. 1, a heat dissipation apparatus 100 includes a structural member 110, a plurality of heating components 120, and a plurality of fans 130. The plurality of heating components 120 are disposed side by side inside the structural member 110. Heat dissipation channels are included inside the plurality of heating components 120. A heat sink 122 is disposed inside the heat dissipation channel. The plurality of fans 130 are respectively disposed inside the heat dissipation channels of the plurality of heating components 120. The heating component 120 is provided with a power device. The power device continuously generates heat during working. The heat of the power device of the heating component 120 may be transferred to the heat sink 122 in the heat dissipation channel.

When the fan 130 works, the fan 130 absorbs gas at an air inlet 121 of the heat dissipation channel into the heat dissipation channel, and airflow is formed. After passing through the heat sink 122, the airflow takes away heat of the heat sink 122, and flows out from an air outlet 123 of the heat dissipation channel, to reduce a temperature of the heating component 120.

In a conventional technology, air inlets 121 of the heat dissipation channels of the plurality of heating components 120 are connected to each other. Air outlets 123 of the heat dissipation channels of the plurality of heating components 120 are connected to each other. When some fans 130 of the plurality of fans 130 stop working due to a fault, a loop is formed between a heat dissipation channel in which a working fan 130 is located and a heat dissipation channel in which a non-working fan 130 is located. In other words, the heat dissipation channel in which the working fan 130 is located absorbs gas from the heat dissipation channel in which the non-working fan 130 is located. High-temperature gas discharged from the heat dissipation channel in which the working fan 130 is located flows into the heat dissipation channel in which the non-working fan 130 is located. In this case, heat generated by the plurality of heating components 120 of the heat dissipation apparatus 100 is circulated in the heat dissipation channels of the plurality of heating components 120, and cannot be discharged to the outside of the heat dissipation apparatus 100, leading to a reduction of heat dissipation efficiency of the heat dissipation apparatus 100.

To resolve a problem that low heat dissipation efficiency may occur in an existing heat dissipation apparatus, embodiments of this application provide a new heat dissipation apparatus and an electric power device.

In embodiments in this application, a heat dissipation apparatus is designed, including: at least two heating components, at least two fans, and at least two isolation components. The heating component includes at least one heat dissipation channel. The at least two fans are respectively disposed inside heat dissipation channels of heating components. The at least two isolation components are respectively coupled to air inlets and/or air outlets of heat dissipation channels of the at least two heating components, and are configured to isolate an air inlet and/or air outlet of the heat dissipation channel of the heating component from an air inlet and/or air outlet of a heat dissipation channel of another heating component. Gas discharged from the heat dissipation channel of the heating component enters a corresponding isolation component, and is discharged to the outside by the isolation component. Alternatively, external gas enters a heat dissipation channel of a corresponding heating component from the isolation component, to prevent air inlets of adjacent heat dissipation channels from being interconnected in a housing or prevent air outlets from being interconnected. When some fans of the at least two fans stop working, a loop cannot be formed between a heat dissipation channel in which a working fan is located and a heat dissipation channel in which a non-working fan is located, so as to prevent gas of the heat dissipation channel in which the working fan is located from backflowing through the heat dissipation channel in which the non-working fan is located.

The following describes, by using several embodiments, a specific implementation process of the technical solutions protected in this application.

Figure 2:
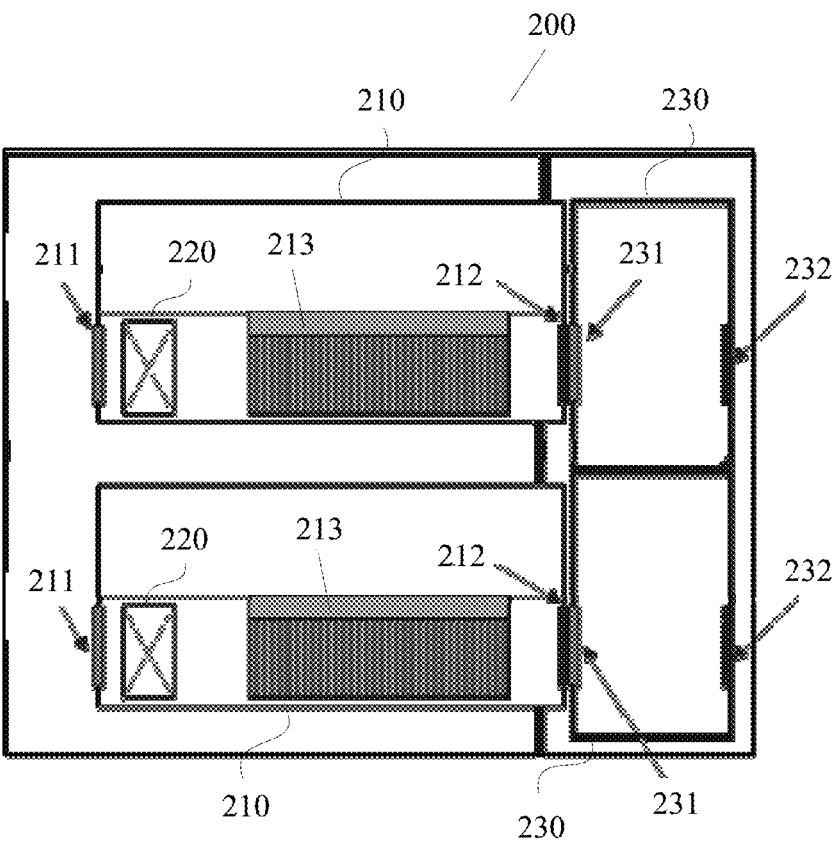
FIG. 2 is a schematic diagram of a structure of a heat dissipation apparatus according to an embodiment of this application.

FIG. 2 is a schematic diagram of a structure of a heat dissipation apparatus according to an embodiment of this application. As shown in FIG. 2, the heat dissipation apparatus 200 includes two heating components 210, two fans 220, and two isolation components 230.

The heating component 210 is a module that integrates a large quantity of devices including power devices, energy storage units, and the like. The heating component 210 is provided with a heat dissipation channel. Heat of a device that generates heat and that is in the heating component 210 may be transferred to gas in the heat dissipation channel, to reduce a temperature of a heating device. The heating component 210 is provided with a power device, such as a direct current/direct current (DC/DC) converter, a resistor, a chip, or a capacitor. The heating component further includes an energy storage unit. The energy storage unit is electrically connected to the power device and is configured to implement energy storage and release. The energy storage unit operates in a "one cluster, one management" mode. Energy storage units and power devices are disposed in one-to-one correspondence. There is a fan in the heat dissipation channel, and the fan is powered by the energy storage unit. The fan rotates at a high speed to drive external air to continuously enter the heat dissipation channel from an air inlet of the heat dissipation channel. Heat generated by the energy storage unit and the power device is continuously exchanged by using a wall body of the heat dissipation channel. Gas with heat exchanged is discharged from an air outlet of the heat dissipation channel under the action of the fan. If the energy storage unit or the power device stops working due to a fault, the fan also stops working. Consequently, normal dissipation cannot be performed in the heat dissipation channel.

In an embodiment, the heat dissipation channel is provided with a heat sink 213. The heat sink 213 may be disposed on a surface that is of the heat dissipation channel and that is close to a side on the power device. When the power device generates heat, the heat may be quickly transferred to the heat sink 213. The heat sink 213 transfers the heat to gas in the heat dissipation channel, so as to improve heat dissipation efficiency of the heating component 210. In other embodiments, the heat sink 213 may be a metal sheet, heat dissipation fins, or another device having a heat dissipation function.

The fan 220 is disposed in the heat dissipation channel of the heating component 210. When the fan 220 works, the gas in the heat dissipation channel may form airflow, the airflow flows from an air inlet 211 of the heat dissipation channel to an air outlet 212 of the heat dissipation channel, and takes away heat of the heating component 210, so as to reduce a temperature of the heating component 210.

The isolation component 230 may be a sealed structure. The isolation component 230 is provided with an air inlet 231 and an air outlet 232. In an embodiment, as shown in FIG. 2, the air inlet 231 of the isolation component 230 may be coupled to the air outlet 212 of the heat dissipation channel of the heating component 210, so that the air outlet 212 of the heating component 210 may be isolated from an air outlet 212 of another heating component 210, so as to avoid a loop formed between the air outlet 212 of the heating component 210 and the air outlet 212 of the another heating component 210. In this case, the air inlet 211 of the heating component 210 is connected to the outside. The air outlet 232 of the isolation component 230 is connected to the outside. Under the action of the fan 220, external gas enters the heat dissipation apparatus 200 through the air inlet 211 of the heat dissipation channel of the heating component 210. High-temperature gas inside the isolation component 230 is discharged to the outside of the heat dissipation apparatus 200 through the air outlet 232, so as to reduce a temperature of the heating component 210.

Figure 3:
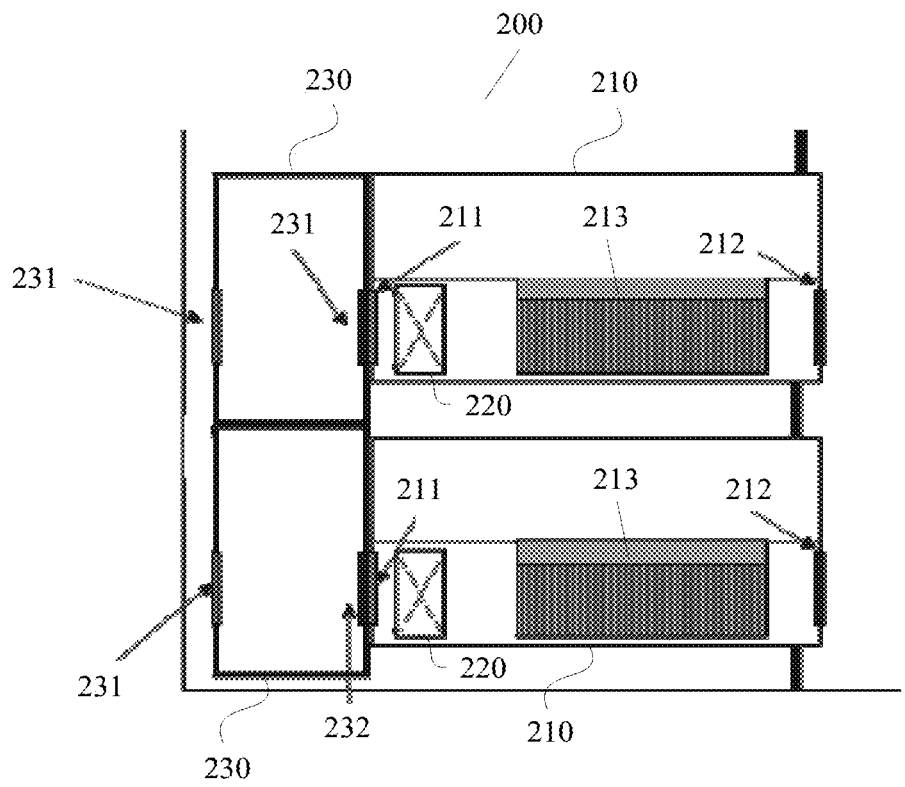
FIG. 3 is a schematic diagram of an airflow direction in an isolation component according to an embodiment of this application.

In an embodiment, as shown in FIG. 3, the air outlet 232 of the isolation component 230 may be coupled to the air inlet 211 of the heat dissipation channel of the heating component 210, so that the air inlet 211 of the heating component 210 may be isolated from an air inlet 211 of another heating component 210, so as to avoid a loop formed between the air inlet 211 of the heating component 210 and the air inlet 211 of the another heating component 210. In this case, the air inlet 231 of the isolation component 230 is connected to the outside. The air outlet 212 of the heating component 210 is connected to the outside. Under the action of the fan 220, external gas enters the heat dissipation apparatus 200 through the air inlet 231 of the isolation component 230. High-temperature gas inside the heating component 210 is discharged to the outside of the heat dissipation apparatus 200 through the air outlet 212, so as to reduce a temperature of the heating component 210.

In this application, a flow direction of gas between the air inlet 231 of the isolation component 230 and the air outlet 232 of the isolation component 230 is related to installation positions of the plurality of heating components 210. As shown in FIG. 2, the plurality of heating components 210 are disposed side by side, air inlets 211 of the plurality of heating components 210 are located on a same side, and air outlets 212 of the plurality of heating components 210 are located on a same side. In this case, the air inlet 211 of the heating component 210, the air outlet 212 of the heating component 210, the air inlet 231 of the isolation component 230, and the air outlet 232 of the isolation component 230 are on a straight line, so that gas flows in the heat dissipation apparatus 200 along a straight line, so as to improve a gas flow speed. In other embodiments, the air outlet 232 of the isolation component 230 may be not on a straight line with the air inlet 211 of the heating component 210, the air outlet 212 of the heating component 210, and the air inlet 231 of the isolation component 230.

Figure 4:
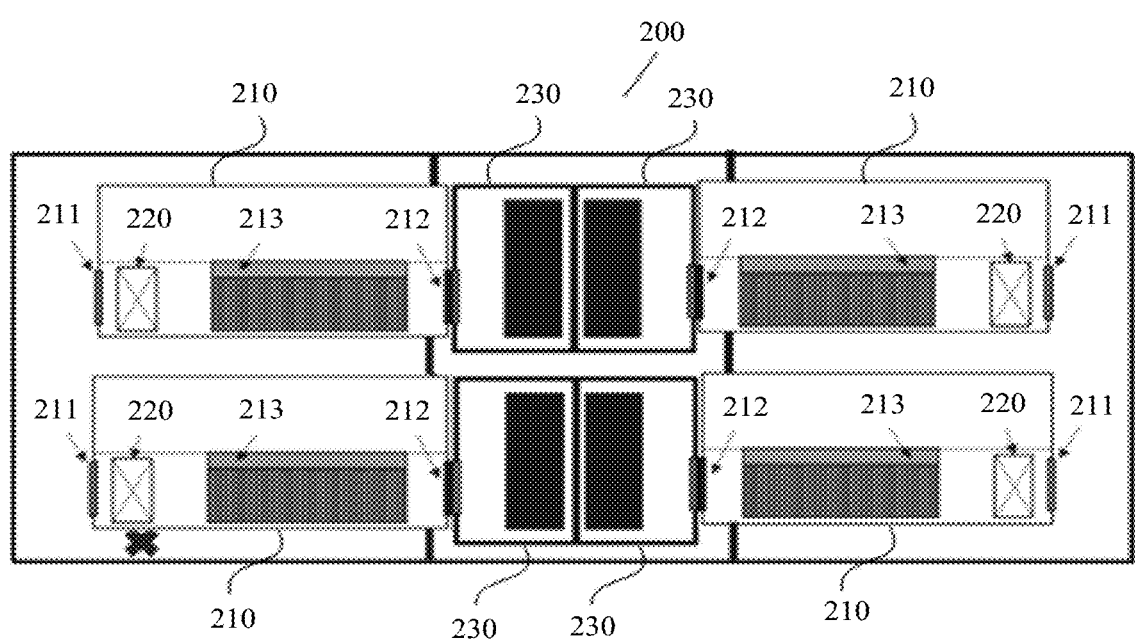
FIG. 4 is a schematic diagram of a structure of an isolation component according to an embodiment of this application.

As shown in FIG. 4, a heat dissipation apparatus 200 includes four heating components 210. The four heating components 210 are divided into two groups, and heating components 210 in each group are disposed side by side. Air inlets 211 of the heating components 210 in each group are disposed on a structural member of the heat dissipation apparatus 200. Air outlets 212 of the heating components 210 in each group are close to each other.

The heat dissipation apparatus 200 further includes four isolation components 230. The four isolation components 230 may be divided into two groups, and isolation components 230 in each group are installed together. An air inlet 231 of each isolation component 230 is coupled to an air outlet 212 of a heating component 210. An air outlet 232 of each isolation component 230 is disposed on a structural member of the heat dissipation apparatus 200.

Figure 5:
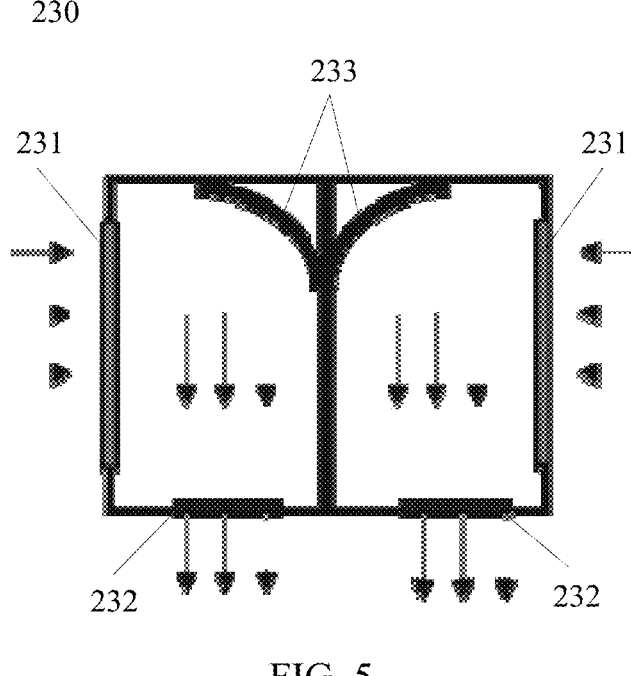
FIG. 5 is a schematic diagram of a structure of a heat dissipation apparatus according to an embodiment of this application.

As shown in FIG. 5, two isolation components 230 are disposed back to back. Air inlets 231 of the two isolation components 230 are located on two opposite sides. Air outlets 232 of the two isolation components 230 are located on a same side. In this case, the air inlet 211 of the heating component 210, the air outlet 212 of the heating component 210, and the air inlet 231 of the isolation component 230 are located on a straight line. An air outlet direction of the air outlet 232 of the isolation component 230 is not on the straight line of the air inlet 211 of the heating component 210, the air outlet 212 of the heating component 210, and the air inlet 231 of the isolation component 230, and is perpendicular to the straight line. Under the action of a fan 220, external gas enters the heat dissipation apparatus 200 through the air inlet 231 of the isolation component 230. The gas enters the isolation component 230 along the straight line, and a direction is changed. The gas is discharged from the air outlet 232 of the isolation component 230 to the outside of the heat dissipation apparatus 200.

The isolation component 230 is disposed in an L shape. An airflow direction of the air inlet 231 of the isolation component 230 is disposed perpendicular to an airflow direction of the air outlet 232. In an embodiment, the four heating components 210 are disposed inside the heat dissipation apparatus 200. Two of the four heating components 210 are stacked on one side, and heating components 210 on two sides are symmetrically disposed. Heat dissipation channels of the four heating components 210 are disposed in two rows and opposite to each other. An air outlet 212 of a heat dissipation channel of each heating component 210 is connected to an air inlet 231 of an L-shaped isolation component 230, and gas is discharged to the outside through an air outlet 232 of the L-shaped isolation component 230, so as to meet a requirement of opposite arrangement of the heating components 210, reduce a flow distance of airflow and a space occupation proportion of the isolation component 230, and improve space utilization of an entire machine.

In this application, the airflow enters an inner cavity of the isolation component 230 from the air inlet 231 of the isolation component 230, and is discharged from an air outlet 232 of the isolation component 230. The airflow direction of the air inlet 231 and the airflow direction of the air outlet 232 are disposed at an angle. To meet different installation requirements, positions of the air inlet 231 and the air outlet 232 of the isolation component 230 may be changed based on positions of different remaining space in a structural member of the heat dissipation apparatus 200.

A shape of the isolation component 230 may be disposed as required according to an installation requirement, and is not limited to an L shape, and may alternatively be any other shape. This is not limited in this application. A material of the isolation component 230 is a material with relatively high heat resistance and tensile strength, such as a metal, an alloy, or a carbon fiber. The isolation component 230 is made of a material with relatively high heat resistance and tensile strength, so that high-temperature deformation and a resistance crack can be avoided in a process in which the airflow continuously flows in the heat dissipation channel after heat exchange.

An air baffle 233 is disposed between the air inlet 231 and the air outlet 232 inside the isolation component 230, and is configured to change a direction of airflow that enters the air inlet, and change airflow in a first direction to airflow in a second direction. High-temperature gas of the heating component 210 enters the isolation component 230 through the air inlet 231 of the isolation component 230. After a direction of the high-temperature gas is changed by the air baffle 233, the high-temperature gas is discharged to the outside of the heat dissipation apparatus 200 through the air outlet 232. Because an air inlet direction of the air inlet 231 of the isolation component 230 and an air outlet direction of the air outlet 232 of the isolation component 230 are not on a straight line, after the high-temperature gas flows into the air inlet 231 of the isolation component 230, turbulence is formed inside the isolation component 230, reducing a flow speed of the gas.

In this application, the air baffle 233 is an arc-shaped baffle, and is welded or bolted to a corner of the airflow in the isolation component 230. The air baffle 233 is configured to reduce noise caused by a change of the airflow, and avoid impact force of the airflow on a pipe, to accelerate flow of gas in the isolation component 230. The air baffle 23 is made of a same material as a material of the isolation component 230, so that the air baffle 233 has same heat resistance and tensile strength as the isolation component.

Figure 6:
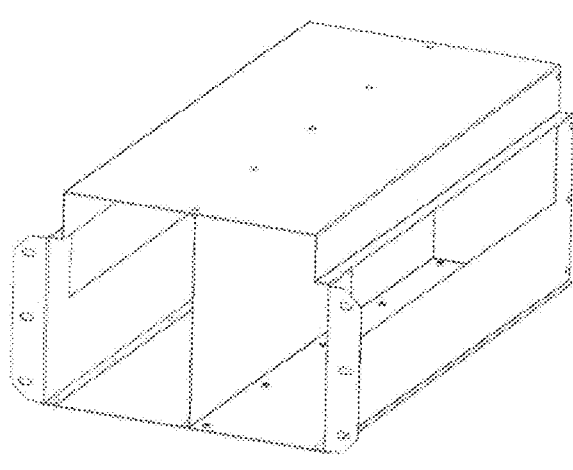
FIG. 6 is a schematic diagram of a structure of a heat dissipation apparatus according to an embodiment of this application.

As shown in FIG. 6, two isolation components 230 are an integrated structure and share one isolation board to form a first isolation area and a second isolation area, so that the first isolation area and the second isolation area are isolated from each other. Gas discharged from two heat dissipation channels is respectively discharged from the corresponding first isolation area and second isolation area to the outside. The air inlet 231 of the isolation component 230 may be disposed to match a shape of the air outlet 212 of the heat dissipation channel of the heating component 210, and may be a rectangular structure or a circular structure. The air outlet 232 of the isolation component 230 is configured as large as possible based on a shape of the air outlet 232, to improve a speed of discharging airflow to the outside.

A plurality of bolt holes is disposed at an edge of the air outlet 232 of the isolation component 230. When the air outlet 232 of the isolation component 230 is coupled to a structural member of the heat dissipation apparatus 200, the plurality of bolt holes of the isolation component 230 and bolt holes of the structural member of the heat dissipation apparatus 200 are aligned, and are fastened by using screws, so as to fasten the air outlet 232 of the isolation component 230 onto the structural member of the heat dissipation apparatus 200.

As shown in FIG. 4, the plurality of isolation components 230 are symmetrically disposed or disposed in parallel in a stacked manner. If the plurality of heating components 210 are symmetrically disposed, corresponding isolation components 230 are symmetrically disposed. In addition, an airflow direction of the air inlet 231 of the isolation component 230 and an airflow direction of the air outlet 232 of the isolation component 230 are disposed at an angle, so as to discharge gas in the isolation component 230 to the outside. If the plurality of heating components 210 are disposed in parallel in a stacked manner, the corresponding isolation components 230 are disposed in parallel in a stacked manner. In addition, the airflow direction of the air inlet 231 of the isolation component 230 and the airflow direction of the air outlet 232 of the isolation component 230 are disposed in a same direction, so that external gas is introduced into a heat exchange channel of a corresponding heating component 210 through the isolation component, or gas in the heat exchange channel of the heating component 210 enters an external atmosphere through the isolation component 230. This adapts to a requirement for an arrangement change of different heating components 210.

In an embodiment, adjacent isolation components 230 may share one side panel, so that the adjacent isolation components 230 form mutually isolated ventilation areas, to reduce the use of consumables and facilitate installation and removal of the isolation component.

In an embodiment, the air outlet 232 of the isolation component 230 may be freely disposed on the structural member of the heat dissipation apparatus 200.

In this embodiment of this application, heat dissipation channels are disposed inside at least two heating components 210, and a fan 220 is disposed in each heat dissipation channel. Isolation components 230 are coupled to air inlets and/or air outlets of the heat dissipation channels. The isolation components 230 may isolate an air inlet or air outlet of each heating component 210 from an air inlet or air outlet of another heating component, so as to avoid the following case: Heat dissipation efficiency of the heat dissipation apparatus 200 is reduced because a loop is formed between a heat dissipation channel in which a working fan is located and a heat dissipation channel in which a nonworking fan is located.

An embodiment of this application provides an electric power device. The electric power device includes at least one heat dissipation apparatus 200. The heat dissipation apparatus 200 may be the heat dissipation apparatus 200 recorded in FIG. 2 to FIG. 6 and the foregoing corresponding protection solutions. Because the electric power device includes the heat dissipation apparatus 200, the electric power device has all or at least some advantages of the heat dissipation apparatus 200. An electric power device may be a device such as a base station, an outdoor cabinet, or a new energy vehicle.

Position relationships, quantities, shapes, internal airflow directions, structures, and the like of the heating component and the isolation component of the heat dissipation apparatus 200 provided in embodiments of this application are not limited to the foregoing embodiments. All technical solutions implemented in the principle of this application fall within the protection scope of the solutions. Any one or more embodiments or figures in this specification, and technical solutions that are combined in a proper manner fall within the protection scope of the solutions.

Finally, it is noted that the foregoing embodiments are merely used to describe the technical solutions of this application. A person of ordinary skill in the art should understand that, although this application is described in detail with reference to the foregoing embodiments, modifications may still be made to the technical solutions described in the foregoing embodiments, or equivalent replacements may still be made to some technical features thereof. Such modifications or replacements do not make the essence of the corresponding technical solutions depart from the spirit and scope of the technical solutions of embodiments of this application.

What is claimed is:

1. A heat dissipation apparatus, comprising:
a plurality of heating components each comprising at least one heat dissipation channel disposed inside, wherein each heat dissipation channel comprises:
a fan;
a first air inlet; and
a first air outlet;
at least two isolation components;
a sealed structure; and
at least one isolation board disposed in the sealed structure to isolate the at least two isolation components,
wherein the at least two isolation components are:
(i) respectively coupled to the first air inlet and the first air outlet of each of the at least one heat dissipation channel and configured to:
isolate the first air inlet of the heat dissipation channel of one of the plurality of heating components from the first air inlet of the heat dissipation channel of another of the plurality of heating components; and
isolate the first air outlet of the heat dissipation channel of one of the plurality of heating components from the first air outlet of the heat dissipation channel of another of the plurality of heating components;
(ii) respectively coupled to the first air inlet of the heat dissipation channel of each of the plurality of heating components and configured to isolate the first air inlet of the heat dissipation channel of one of the plurality of heating components from the first air inlet of the heat dissipation channel of another of the plurality of heating components; or
(iii) respectively coupled to the first air outlet of the heat dissipation channel of each of the plurality of heating components and configured to isolate the first air outlet of the heat dissipation channel of one of the plurality of heating components from the first air outlet of the heat dissipation channel of another of the plurality of heating components.

2. The heat dissipation apparatus of claim 1, wherein the at least two isolation components comprise a second air inlet and a second air outlet, and wherein a first airflow direction of the second air inlet and a second airflow direction of the second air outlet are disposed at an angle.

3. The heat dissipation apparatus of claim 2, wherein the at least two isolation components further comprise an air baffle disposed inside the at least two isolation components and configured to change airflow in a first direction into airflow in a second direction, and wherein the first direction and the second direction are different directions.

4. The heat dissipation apparatus of claim 2, further comprising at least two heat sinks disposed inside the at least one heat dissipation channel, wherein the at least two heat sinks are configured to transfer heat of the heating components to gas in the at least one heat dissipation channel.

5. The heat dissipation apparatus of claim 2, wherein the at least two isolation components further comprise:
    second air outlets; and
    at least one bolt hole disposed at edges of the second air outlets, wherein the at least one bolt hole is configured to:
        allow at least one screw to pass through the at least one bolt hole; and
        fasten the second air outlets onto a structural member of the heat dissipation apparatus.

6. The heat dissipation apparatus of claim 2, wherein the at least two isolation components are at least one of symmetrically disposed or disposed in parallel in a stacked manner.

7. The heat dissipation apparatus of claim 1, wherein the at least two isolation components comprise a second air inlet and a second air outlet, and wherein the first air inlet, the first air outlet, the second air inlet, and the second air outlet are arranged in a straight line.

8. The heat dissipation apparatus of claim 7, wherein the at least two isolation components further comprise an air baffle disposed inside the at least two isolation components and configured to change airflow in a first direction into airflow in a second direction, and wherein the first direction and the second direction are different directions.

9. The heat dissipation apparatus of claim 7, further comprising at least two heat sinks disposed inside the at least one heat dissipation channel and configured to transfer heat of the heating components to gas in the at least one heat dissipation channel.

10. The heat dissipation apparatus of claim 7, wherein the at least two isolation components further comprise:
    second air outlets; and
    at least one bolt hole disposed at edges of the second air outlets and configured to:
        allow at least one screw to pass through the at least one bolt hole; and
        fasten the second air outlets onto a structural member of the heat dissipation apparatus.

11. The heat dissipation apparatus of claim 7, wherein the at least two isolation components are at least one of symmetrically disposed or disposed in parallel in a stacked manner.

12. The heat dissipation apparatus of claim 1, wherein the at least two isolation components further comprise an air baffle disposed inside the at least two isolation components, wherein the air baffle is configured to change airflow in a first direction into airflow in a second direction, and wherein the first direction and the second direction are different directions.

13. The heat dissipation apparatus of claim 12, wherein the air baffle is in an arc shape.

14. The heat dissipation apparatus of claim 1, further comprising at least two heat sinks disposed inside the at least one heat dissipation channel, wherein the at least two heat sinks are configured to transfer heat of the heating components to gas in the at least one heat dissipation channel.

15. The heat dissipation apparatus of claim 1, wherein the at least two isolation components further comprise:
    second air outlets; and
    at least one bolt hole disposed at edges of the second air outlets and configured to:
        allow at least one screw to pass through the at least one bolt hole; and
        fasten the second air outlets onto a structural member of the heat dissipation apparatus.

16. The heat dissipation apparatus of claim 1, wherein the at least two isolation components are at least one of symmetrically disposed or disposed in parallel in a stacked manner.

17. An electric power device, comprising:
    a structural member; and
    at least one heat dissipation apparatus disposed inside the structural member and comprising:
        a plurality of heating components each comprising at least one heat dissipation channel disposed inside, wherein each heat dissipation channel comprises:
        a fan;
        a first air inlet; and
        a first air outlet;
        at least two isolation components, components;
        a sealed structure; and
        at least one isolation board disposed in the sealed structure to isolate the at least two isolation components,
    wherein the at least two isolation components are:
        (i) respectively coupled to the first air inlet and the first air outlet of the heat dissipation channel of each of the plurality of heating components, and configured to:
            isolate the first air inlet of the heat dissipation channel of one of the plurality of heating components from the first air inlet of the heat dissipation channel of another of the plurality of heating components; and
            isolate the first air outlet of the heat dissipation channel of one of the plurality of heating components from the first air outlet of the heat dissipation channel of another of the plurality of heating components;
        (ii) respectively coupled to the first air inlet of the heat dissipation channels of each of the plurality of heating components, and configured to isolate the first air inlet of the heat dissipation channel of one of the plurality of heating components from the first air inlet of the heat dissipation channel of another of the plurality of heating components; or
        (iii) respectively coupled to the first air outlet of the heat dissipation channel of each of the plurality of heating components, and configured to isolate the first air outlet of the heat dissipation channel of one of the plurality of heating components from the first air outlet of the heat dissipation channel of another of the plurality of heating components.

18. The electric power device of claim 17, wherein the at least two isolation components comprise a second air inlet and a second air outlet, and wherein a first airflow direction of the second air inlet and a second airflow direction of the second air outlet are disposed at an angle.

19. The electric power device of claim 17, wherein the at least two isolation components comprise a second air inlet and a second air outlet, and wherein the first air inlet, the first air outlet, the second air inlet, and the second air outlet are arranged in a straight line.

20. A heat dissipation apparatus, comprising:

a plurality of heating components each comprising at least one heat dissipation channel disposed inside, wherein each heat dissipation channel comprises:

an air inlet; and an air outlet;

at least two isolation components;

a sealed structure; and at least one isolation board disposed in the sealed structure to isolate the at least two isolation components, wherein the at least two isolation components are:

(i) respectively coupled to the air inlet and the air outlet of each of the at least one heat dissipation channel and configured to:

isolate the air inlet of the heat dissipation channel of one of the plurality of heating components from the air inlet of the heat dissipation channel of another of the plurality of heating components; and isolate the air outlet of the heat dissipation channel of one of the plurality of heating components from the air outlet of the heat dissipation channel of another of the plurality of heating components;

(ii) respectively coupled to the air inlet of the heat dissipation channel of each of the plurality of heating components and configured to isolate the air inlet of the heat dissipation channel of one of the plurality of heating components from the air inlet of the heat dissipation channel of another of the plurality of heating components; or (iii) respectively coupled to the air outlet of the heat dissipation channel of each of the plurality of heating components and configured to isolate the air outlet of the heat dissipation channel of one of the plurality of heating components from the air outlet of the heat dissipation channel of another of the plurality of heating components.

* * * * *